(12) United States Patent
Hokazono et al.

(10) Patent No.: US 9,437,735 B1
(45) Date of Patent: Sep. 6, 2016

(54) TUNNEL FET

(71) Applicant: KABUSHIKI KAISHA TOSHIBA, Minato-ku, Tokyo (JP)

(72) Inventors: Akira Hokazono, Kawasaki Kanagawa (JP); Yoshiyuki Kondo, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/824,737

(22) Filed: Aug. 12, 2015

(30) Foreign Application Priority Data

May 13, 2015 (JP) ................................ 2015-098221

(51) Int. Cl.
| | |
|---|---|
| H01L 21/02 | (2006.01) |
| H01L 29/78 | (2006.01) |
| H01L 29/417 | (2006.01) |
| H01L 29/167 | (2006.01) |

(52) U.S. Cl.
CPC ......... *H01L 29/7839* (2013.01); *H01L 29/167* (2013.01); *H01L 29/41775* (2013.01)

(58) Field of Classification Search
CPC .................. H01L 29/7839; H01L 29/41775; H01L 29/167
USPC ....................................................... 257/384
See application file for complete search history.

(56) References Cited

U.S. PATENT DOCUMENTS

| | | |
|---|---|---|
| 9,048,267 B2 | 6/2015 | Kondo et al. |
| 2013/0037867 A1 | 2/2013 | Adachi |
| 2014/0054657 A1 | 2/2014 | Hokazono et al. |
| 2014/0209863 A1 | 7/2014 | Kondo et al. |
| 2015/0076553 A1 | 3/2015 | Kondo et al. |

FOREIGN PATENT DOCUMENTS

| | | |
|---|---|---|
| JP | 2006147861 A | 6/2006 |
| JP | 4488870 B2 | 6/2010 |
| JP | 2013089618 A | 5/2013 |

OTHER PUBLICATIONS

Y. Kondo, et al., "Novel Device Architecture Proposal of Source Junctionless Tunneling Field-Effect Transistor (SJL-TFET)", Extended Abstracts of the 2014 International Conference on Solid State Devices and Materials, Tsukuba, 2014, pp. 826 and 827.

*Primary Examiner* — Douglas Menz
(74) *Attorney, Agent, or Firm* — Holtz, Holtz & Volek PC

(57) ABSTRACT

According to one embodiment, a tunnel FET includes a semiconductor region of a first conductivity type, a gate electrode provided on a surface portion of the semiconductor region via a gate insulating film, a source region provided in the semiconductor region on one side of the gate electrode, and a drain region provided in the semiconductor region on the other side of the gate electrode. The source region is a region of either the first conductivity type or a second conductivity type having a higher impurity concentration than the semiconductor region of the first conductivity type. The drain region includes a Schottky barrier junction.

5 Claims, 7 Drawing Sheets

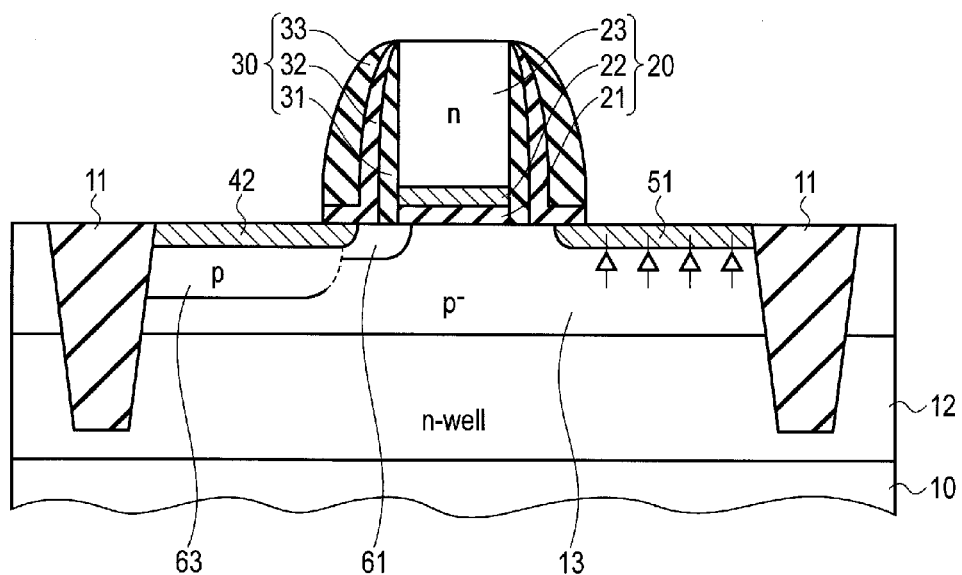
F I G. 7
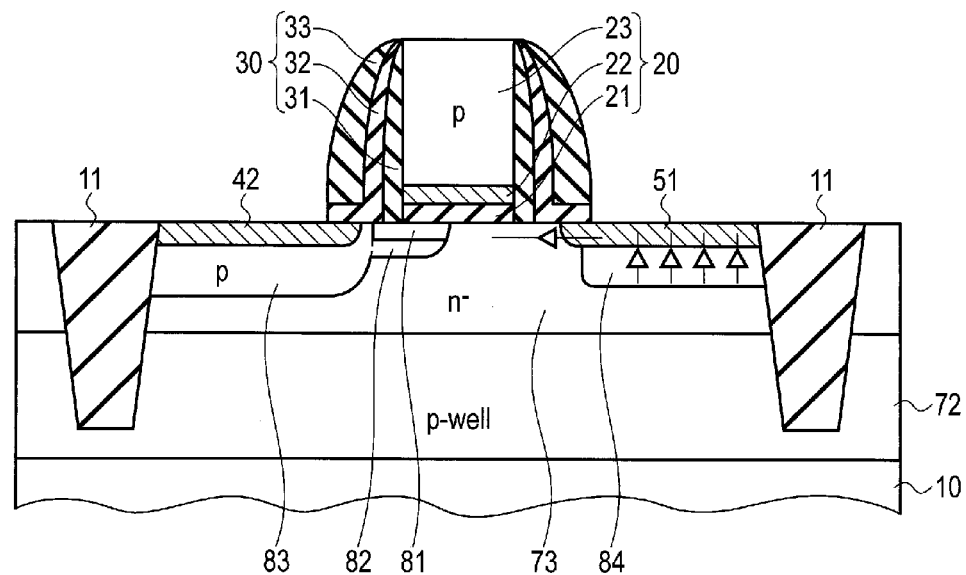
F I G. 9

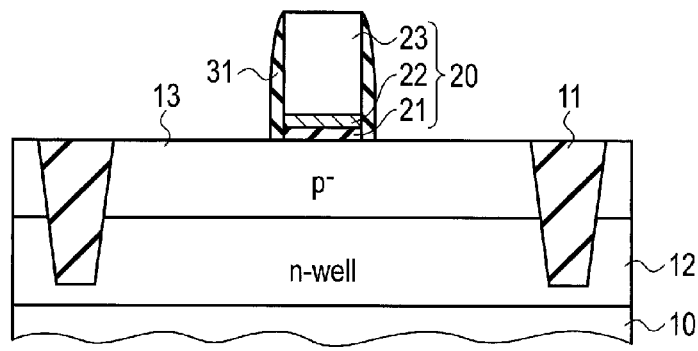
F I G. 8A
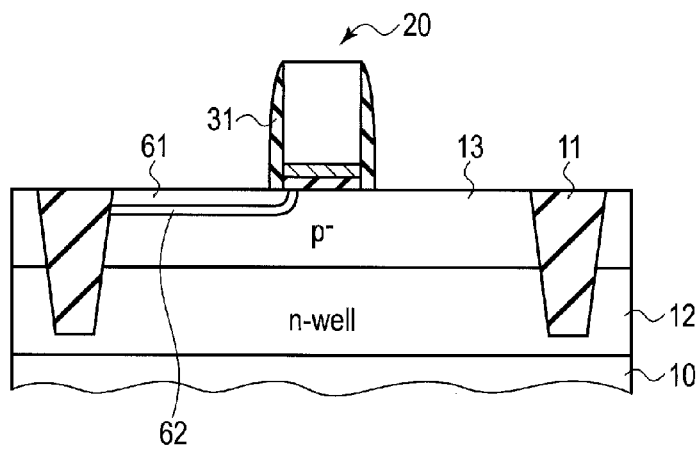
F I G. 8B
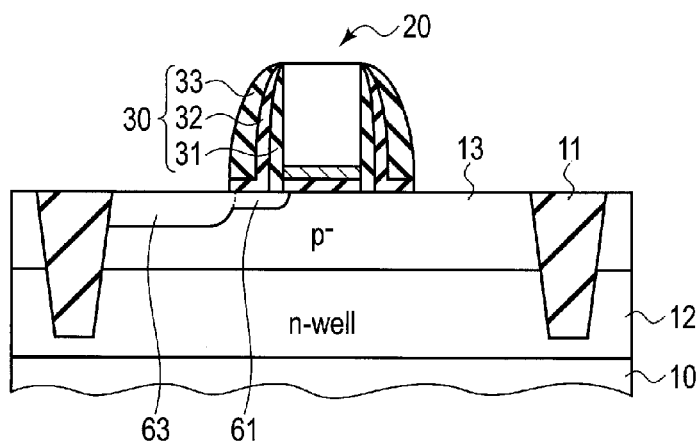
F I G. 8C

TUNNEL FET

CROSS-REFERENCE TO RELATED APPLICATIONS

This application is based upon and claims the benefit of priority from Japanese Patent Application No. 2015-098221, filed May 13, 2015, the entire contents of which are incorporated herein by reference.

FIELD

Embodiments described herein relate generally to a tunnel FET comprising a drain with a Schottky barrier junction.

BACKGROUND

A tunnel FET (TFET) has the advantage that the current at power-off time can be extremely reduced as compared to a MOSFET. However, in forming a junction at a drain region by doping, since junction leakage determines a leak level at power-off time, it is not possible to take full advantage of the TFET.

Although several methods for forming a drain junction in order to solve the above problem have been proposed, the existing methods all have a problem that the process becomes complicated.

BRIEF DESCRIPTION OF THE DRAWINGS

FIG. 7 is a cross-sectional view showing an element structure of a TFET according to a second embodiment.

FIGS. 8A to 8C are cross-sectional views showing a manufacturing process of the TFET of the second embodiment.

FIG. 9 is a cross-sectional view showing an element structure of a TFET according to a third embodiment.

DETAILED DESCRIPTION

In general, according to one embodiment, a tunnel FET includes: a semiconductor region of a first conductivity type; a gate electrode provided on a surface portion of the semiconductor region via a gate insulating film; a source region provided in the semiconductor region on one side of the gate electrode; and a drain region provided in the semiconductor region on the other side of the gate electrode. The source region is a region of either the first conductivity type or a second conductivity type having a higher impurity concentration than the semiconductor region of the first conductivity type. The drain region includes a Schottky barrier junction.

The tunnel FET of the present embodiment will be described with reference to the drawings.

First Embodiment

Figure 1:
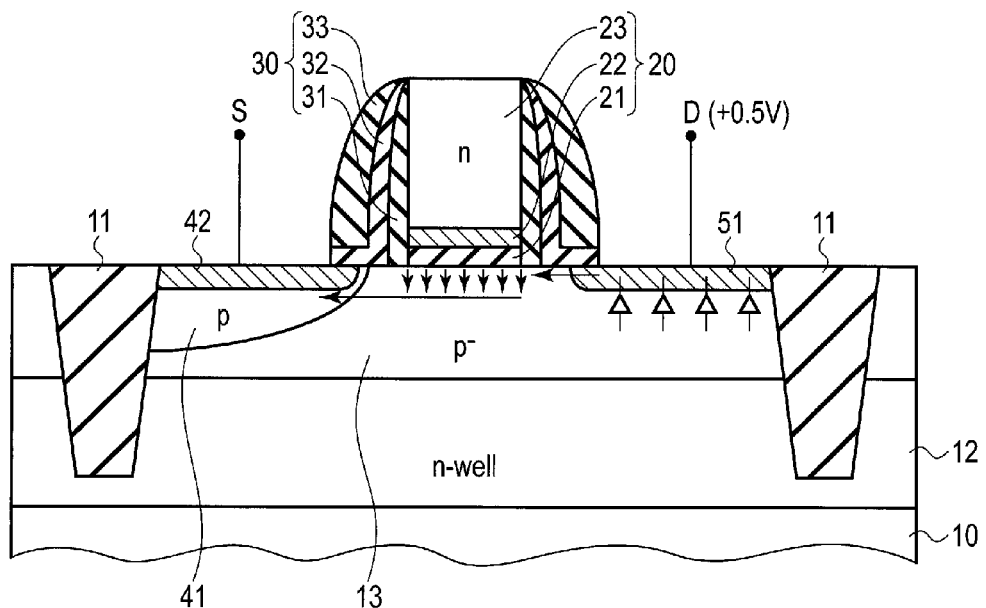
FIG. 1 is a cross-sectional view showing an element structure of a TFET according to a first embodiment.

FIG. 1 shows a cross-sectional view showing an element structure of a TFET according to a first embodiment.

In the present embodiment, in a source functionless (SJL)-TFET, a drain side is formed by a Schottky barrier junction of a silicide and a low-concentration p-layer. In the present embodiment, an n-type TFET will be described as an example. With respect to a p-type TFET, doping species for respective layers are merely changed, and the basic structure is the same as that of the n-type TFET.

An n-type well 12 is formed on a p- or n-type silicon substrate 10, and a p⁻-type layer (a semiconductor region) 13 which serves as a channel layer is formed on the n-type well 12. The impurity concentration of the p⁻-type layer 13 is approximately $10^{19}$ cm$^{-3}$, which is relatively low. In the p⁻-type layer 13, element isolation insulating films 11 are buried so as to separate the layer 13 into a plurality of element formation regions.

At a part of the element formation regions separated by the element isolation insulating films 11, a metal film 22 such as a TiN film is formed via a gate insulating film 21, and a polysilicon gate 23 is formed on the metal film 22.

On a side surface of a gate portion 20 constituted of the gate insulating film 21, the metal film 22, and the polysilicon gate 23, a gate sidewall insulating film 30 is formed. That is, on the side surface of the gate portion 20, a first gate sidewall film 31 of SiN, a second gate sidewall film 32 of TEOS, and a third gate sidewall film 33 of SiN are formed.

At one-end side (i.e., a source region side) of the gate portion 20 of the p⁻-type layer 13, a p-type diffusion layer 41 of high-concentration for source region formation is formed. The impurity concentration of the p-type diffusion layer 41 is approximately $10^{21}$ cm$^{-3}$, and the p-type diffusion layer 41 is formed not to reach the gate portion 20. On the p-type diffusion layer 41, an Ni silicide layer 42 is formed. The Ni silicide layer 42 makes ohmic contact to the p-type diffusion layer 41.

At the other end side (i.e., a drain region side) of the gate portion 20, a Schottky barrier junction is formed by forming an Ni silicide layer 51 on the p⁻-type layer 13. That is, by forming the Ni silicide layer 51 having a smaller work function than the p⁻-type layer 13 on a surface portion of the p⁻-type layer 13, a drain of the Schottky barrier junction is formed.

It should be noted that the silicide formed on the drain side is not limited to the Ni silicide, and may be any as long as the Fermi level exists between a conduction band (Ec) and a valence band (Ev) of silicon. For example, a Ti silicide (TiSi) or a Co silicide (CoSi$_2$) may also be used. Further, the material is not limited to silicide, and metals other than silicide, such as Ta, W, Al, Mo, Co, Ru, and Ni, can also be used.

Further, although not shown in the figures, in the above-described structure, an interlayer film, a contact, a metal interconnect, a passivation film, etc., are to be formed. Furthermore, in the case of an n-type TFET as in the present embodiment, a positive voltage is applied to both of a gate electrode (the metal film 22 and the polysilicon gate 23) and the drain (the Ni silicide layer 51). Conversely, in a p-type TFET, a negative voltage may be applied to both of the gate electrode and the drain.

As can be seen, in the present embodiment, the Ni silicide layer 51 which establishes the Schottky barrier junction is formed without forming a high-concentration diffusion layer on the drain side, whereby a TFET in which the drain is formed by a silicide and a low-concentration doping layer can be realized. When the Schottky barrier junction is formed by a silicide and a low-concentration p-layer, the junction has the rectification of the flow from the p-layer to the silicide layer. Meanwhile, when the Schottky barrier junction is formed by a silicide and a low-concentration n-layer, the junction has the rectification of the flow from the silicide layer to the n-layer.

Figure 2:
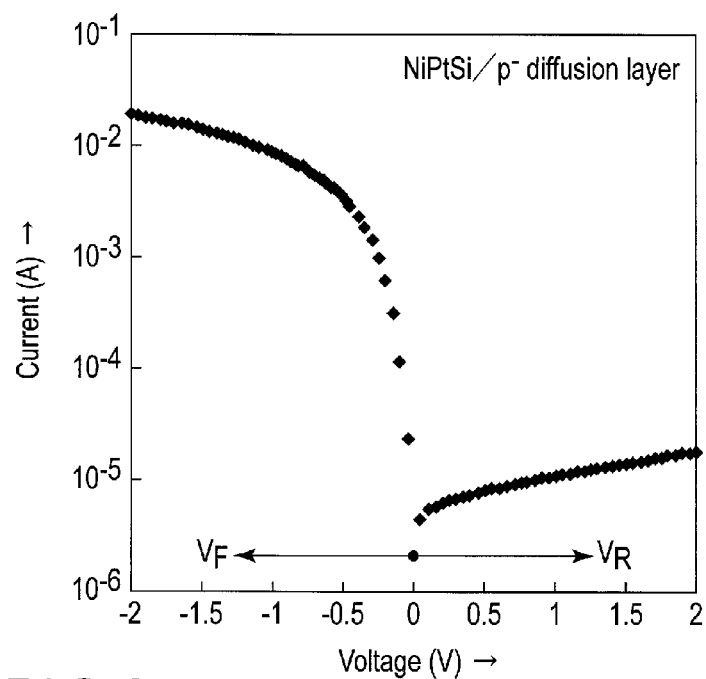
FIG. 2 is a characteristic diagram showing the relationship between a voltage applied to a Schottky barrier junction and a current.

For example, in an n-type TFET as in the present embodiment, when a positive voltage (+0.5 V) is applied to the drain side, a reverse bias is applied to a Schottky diode. At this time, as shown in FIG. 2, it has been confirmed that a leakage current of the Schottky barrier junction portion is reduced, and thus an off-current of a transistor is not increased. Note that FIG. 2 is a graph in which a current that flows at an interface between NiSi (including addition of 10 atm % of Pt) and Si when a voltage is applied to NiSi is plotted with respect to the applied voltage.

Figure 3:
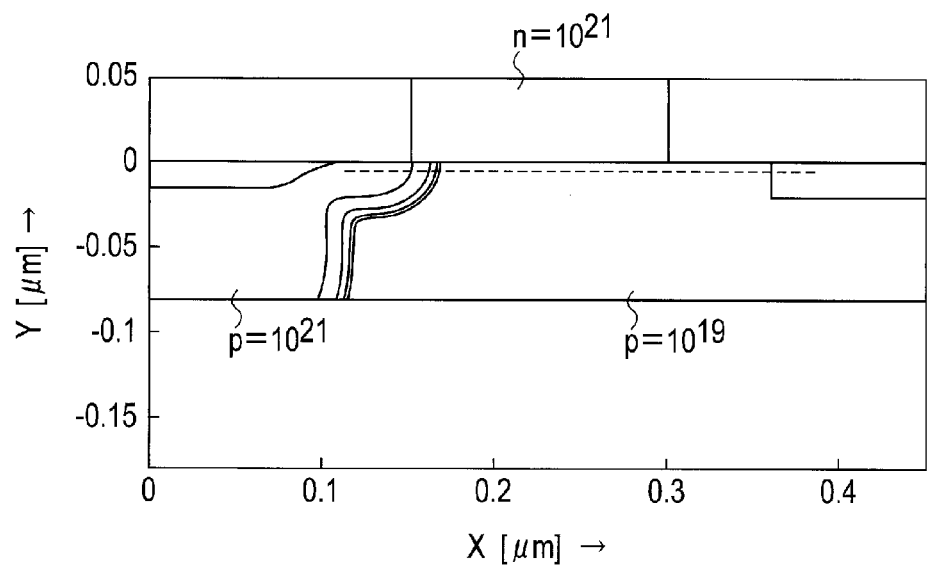
FIG. 3 is a schematic diagram showing an example of an impurity concentration of the TFET of the embodiment.
Figure 4:
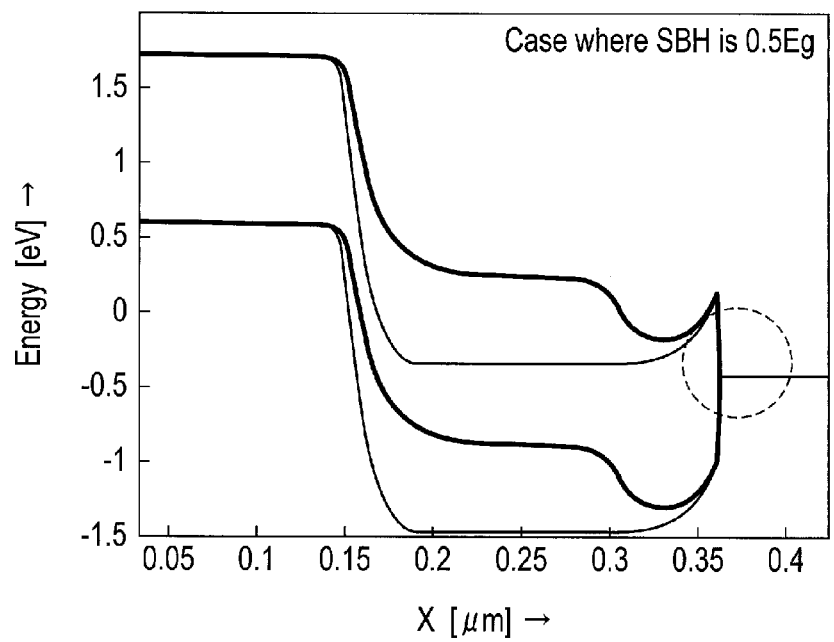
FIG. 4 is a characteristic diagram showing a band structure of a portion indicated by a broken line in FIG. 3.
Figure 5:
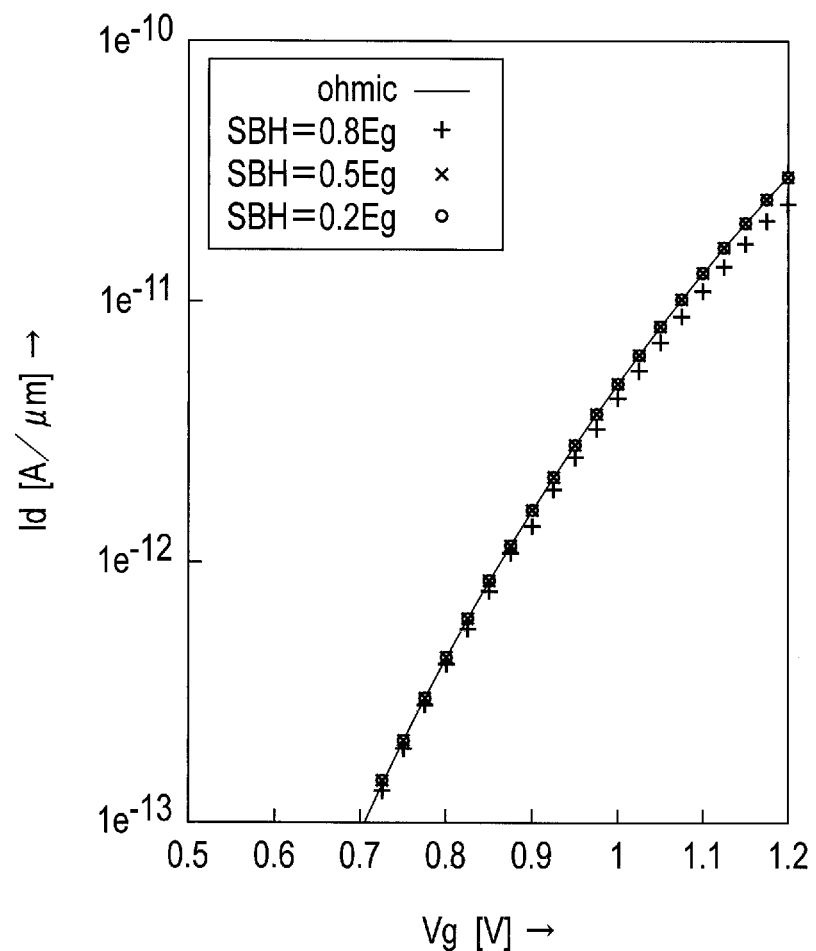
FIG. 5 is a characteristic diagram showing the relationship between a gate application voltage and a drain current.

FIGS. 3 to 5 are illustrations for describing the operation at the drain side of the TFET of the present embodiment. FIG. 3 shows an example of an impurity concentration of the element formation region, FIG. 4 shows a band structure of a portion indicated by a broken line in FIG. 3, and FIG. 5 shows a drain current.

As shown in FIG. 3, the impurity concentration in the element formation region is low ($10^{19}$ cm$^{-3}$) in a channel portion and the drain region, and high ($10^{21}$ cm$^{-3}$) in the source region. It should be noted that FIG. 3 illustrates the case where the p-type diffusion layer, which serves as the source extension, is formed to overlap with the gate electrode in the source region.

In FIG. 4, a thick line represents an energy band diagram when the TFET is in an off-state, and a thin line represents an energy band diagram when the TFET is in an on-state. As shown in FIG. 4, since the drain is formed by the silicide and the low-concentration doping layer, a Schottky barrier height (SBH) is produced on the drain side. Also, a tunnel current differs in some degree depending on the SBH difference when the TFET is in an on-state. However, since tunnel resistance in a tunnel junction is high, as shown in FIG. 5, it has been confirmed that the SBH does not greatly degrade the characteristics. Note that in FIG. 5, the cases where the SBH is 0.2 Eg, 0.5 Eg, and 0.8 Eg, where energy gap of silicon is Eg, are plotted, respectively. The differences in the SBH in FIG. 5 can be controlled by the amount of Pt added to NiSi, for example, and the more Pt is added, the higher the SBH becomes.

FIGS. 6A to 6D are cross-sectional views showing a manufacturing process of the TFET of the present embodiment. Here, a method of forming an n-type TFET is shown, but a basic process of a p-type TFET is the same as that of the n-type TFET except that the doping species are changed.

Figure 6A:
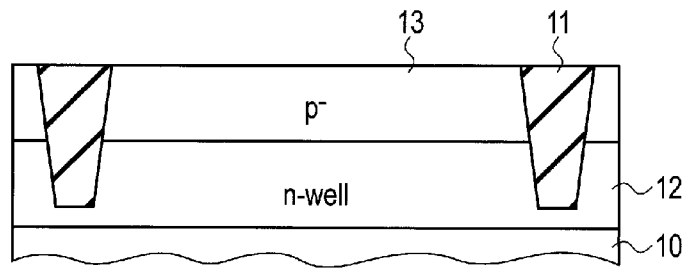
FIGS. 6A to 6D are cross-sectional views showing a manufacturing process of the TFET of the first embodiment.

Firstly, as shown in FIG. 6A, on the p- or n-type silicon substrate 10, the element isolation insulating films 11 having a depth of 200 to 300 nm are formed by a buried element separation method. In an element formation region surrounded by the element isolation insulating films 11, an oxide film (not shown) having a thickness of 10 nm or less is formed on a silicon surface. After that, the n-type well 12, and the p$^-$-type layer 13 (corresponding to a source tunnel junction in an SJL-TFET) which serves as the channel region are formed by ion implantation and activation RTA.

As typical ion implantation conditions, in the n-type well 12, the implantation of phosphorous (P) is performed at 500 keV and $3\times10^{13}$ cm$^{-2}$, and in the p$^-$-layer which serves as the channel region of the n-type well 12 (also corresponding to the source region in the SJL-TFET), the implantation of boron (B) is performed at 10 keV and $1\times10^{14}$ cm$^{-2}$. Also, in forming the p-type TFET, in a p-type well, the implantation is performed with B: 260 keV, $2\times10^{13}$ cm$^{-2}$, and in a channel region of the p-type well (also corresponding to the source region in the SJL-TFET), the implantation is performed with P: 10 keV, $1\times10^{14}$ cm$^{-2}$.

Figure 6B:
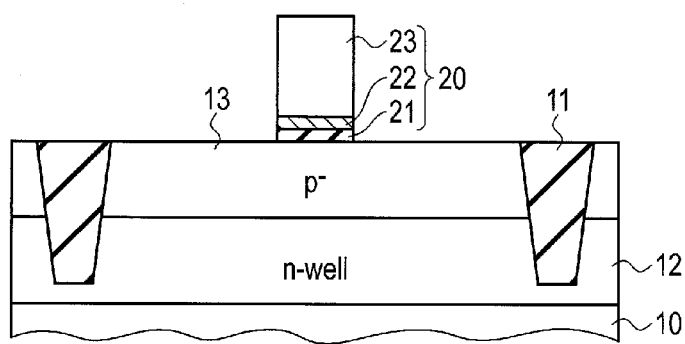

Next, as shown in FIG. 6B, by a thermal oxidation method or an LPCVD method, the gate insulating film 21 having a thickness of 0.5 to 6 nm is formed, and the metal film 22 of TiN film or the like is deposited thereon. Further, the polysilicon gate 23 having a thickness of 50 to 200 nm is deposited, and pre-doping is performed. At this time, n-type doping is performed for the n-type TFET, and p-type doping is performed for the p-type TFET.

As the condition of typical n-type doping, the doping is performed with phosphorous (P) at 5 keV and $5\times10^{15}$ cm$^{-2}$, and as the condition of p-type doping, the doping is performed with boron (B) at 2.5 keV and $5\times10^{15}$ cm$^{-2}$.

Next, by an optical lithography method, an X-ray lithography method, or an electron beam lithography method, a mask (not shown) for gate patterning is formed. Further, by a reactive ion etching (RIE) method, the polysilicon gate 23, the metal film 22, and the gate insulating film 21 are selectively etched, thereby forming the gate portion 20. Here, as the gate insulating film 21, the material is not limited to SiO$_2$, and SiON, SiN, or a high-dielectric film such as HfSiON can also be used.

Figure 6C:
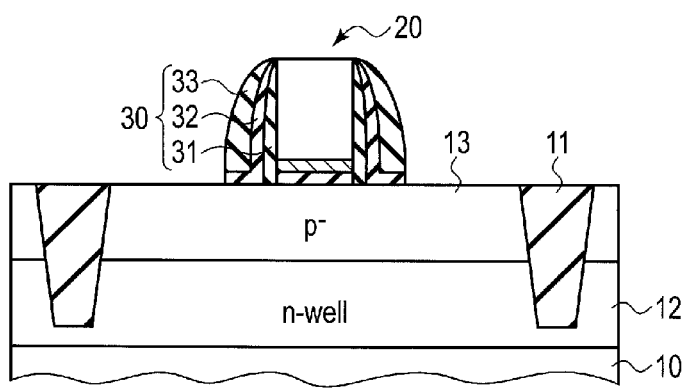

Next, as shown in FIG. 6C, the gate sidewall insulating film 30 is formed on the side surface of the gate portion 20 with TEOS or SiN, or a combination of TEOS and SiN. More specifically, on a gate sidewall, the first gate sidewall film 31 of SiN, the second gate sidewall film 32 of TEOS, and the third gate sidewall film 33 of SiN are formed.

Figure 6D:
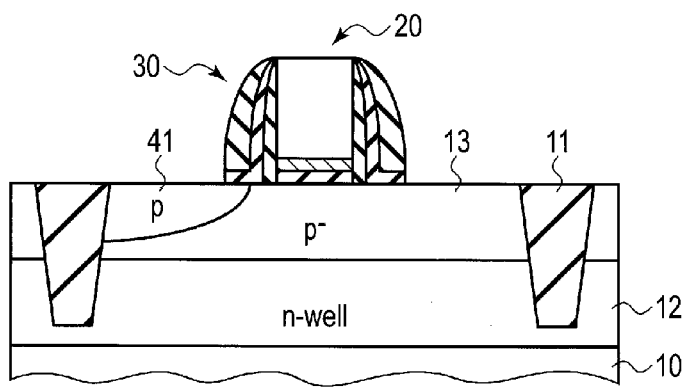

Next, after forming resist films (not shown) on the entire surface, the resist films on the source region are opened. Further, by using the resist films as a mask, high-concentration p$^+$ doping is performed. In the case of a p-type TFET, high-concentration n$^+$ doping is performed. More specifically, in the p$^+$ doping, the doping is performed with B at 2 key and $2\times10^{15}$ to $4\times10^{15}$ cm$^{-2}$, and in the n$^+$ doping, the doping is performed with As at 10 keV and $2\times10^{15}$ to $4\times10^{15}$ cm$^{-2}$. After that, by performing activation annealing, as shown in FIG. 6D, the p-type diffusion layer 41 of high-concentration in the source region is formed. As the annealing condition, spike annealing (1030° C.) or the like may be adopted.

After annealing is performed, the Ni silicide layer 42 is formed on the source side, and the Ni silicide layer 51 is further formed on the drain side. In this way, the ohmic contact on the source side and the Schottky barrier junction on the drain side are formed, and the structure as shown in FIG. 1 described above can be obtained.

Further, while the n-type TFET has been described referring to FIGS. 6A to 6D, the n- and the p-type TFETs may be formed simultaneously. Also, after forming the structure of FIG. 1, general formation of an interlayer film, a contact, a metal interconnect, a passivation film, etc. may be performed as necessary.

As can be seen, according to the present embodiment, the drain side of the n-type TFET is formed by the Schottky barrier junction of the Ni silicide 51 and the low-concentration p⁻-type layer 13. Consequently, a TFET capable of reducing junction leakage on the drain side can be realized without complicating the device structure or manufacturing process. That is, an off-current can be reduced by forming the drain by the Schottky barrier junction so that a pn junction is not formed on the drain side. Accordingly, it becomes possible to derive the feature of a reduced current at power-off time, which is the feature of the TFET. Further, it has been confirmed that parasitic resistance is not increased in the Schottky barrier junction.

Here, in forming the drain region in the TFET with a pn junction by way of doping, there is a problem that a reverse current in the pn junction is generated, and the off-current of the transistor is increased. For example, in the SJL-TFET in which a tunnel junction according to a pn structure is not formed on the source side, the SJL-TFET is operated as a TFET by controlling the tunnel current generated under the gate electrode. However, the concentration in the tunnel junction (corresponding to a channel in a general MOSFET) is approximately $1 \times 10^{19}$ cm$^{-3}$. Although the above concentration is low as the concentration in the junction, the concentration is substantially equivalent to a channel concentration including Halo ion implantation of a scaled gate MOSFET. Accordingly, the pn junction formed in the high-concentration diffusion layer on the drain side is established as the junction of layers both having sufficiently high impurity concentrations. Accordingly, the junction leakage is significant, and a problem that a junction capacitance is increased arises. That is, the feature of reducing an off-current by the TFET structure is hard to be obtained with the above-described structure.

In order to solve this problem, various methods for reducing the junction leakage have been proposed. For example, a method which can be adopted is to recess a source/drain region, and form a high-concentration diffusion layer after burying a non-doped Si layer. However, with this structure, while it becomes possible to reduce the junction leakage and junction capacitance, adopting this structure causes a problem that the device structure becomes complicated and the degree of difficulty of the process is also made higher.

In contrast, in the present embodiment, the drain region is not formed by a pn junction by way of doping, but is formed by the Schottky barrier junction by way of metal (including silicide) and low-concentration doping. In this Schottky barrier junction, since the junction leakage can be reduced, it is possible to take advantage of the feature of a TFET whereby the current at power-off time can be significantly reduced as compared to a MOSFET. Also, the present embodiment has the advantage that a TFET can be manufactured with a simple process without needing to perform the process of recess, etc.

Second Embodiment

FIG. 7 shows a cross-sectional view showing an element structure of a TFET according to a second embodiment. It should be noted that the same portions as those of FIG. 1 will be given the same reference numbers, and detailed explanations of them will be omitted.

In the present embodiment, in a horizontal TFET proposed as a general TFET, the drain side is formed by a Schottky barrier junction of a silicide and a low-concentration p-layer.

The basic structure of the present embodiment is similar to that of the first embodiment, and the point in which the present embodiment is different from the first embodiment is the structure on the source side. That is, on the source side of the present embodiment, a p-type diffusion layer 63 of high-concentration for source region formation is formed as in the first embodiment, and further, a p-type diffusion layer 61 which is of the same kind as a source region is extended from the source region so that it overlaps with a part of a gate portion 20.

FIGS. 8A to 8C are cross-sectional views showing a manufacturing process of the TFET of the present embodiment.

Firstly, as in the first embodiment, element isolation insulating films 11, an n-type well 12, and a p⁻-type layer 13 are formed on a silicon substrate 10, and further, the gate portion 20 is formed on the p⁻-type layer 13, as shown in FIG. 6B mentioned above.

Next, as shown in FIG. 8A, a first gate sidewall film 31 of SiN, for example, is formed, and this is used as an offset spacer. More specifically, after forming SiN to be 3 to 12 nm thick by the LPCVD method, the offset spacer is formed as a result of etching by RIE.

Next, as shown in FIG. 8B, in order to form a tunnel junction, doping is performed in the source region. More specifically, after forming resist films on the entire surface, the source region is opened. Then, after performing angular ion implantation with As at 40 keV and $3 \times 10^{13}$ cm$^{-2}$, ion implantation is performed with BF$_2$ at 2 keV and $10^{15}$ cm$^{-2}$, as the typical condition, thereby forming the tunnel junction on the source side. In this way, the p-type diffusion layer 61 which serves as the source extension, and an n-type diffusion layer 62 which serves as a Halo region are formed.

Further, in the case of a p-type TFET, the source region is opened, and after performing angular ion implantation with BF$_2$ at 20 keV and $3 \times 10^{13}$ cm$^{-2}$, ion implantation is performed with As at 1 keV and $10^{15}$ cm$^{-2}$, as the typical condition, thereby forming a tunnel junction on the source side.

Next, as shown in FIG. 8C, a gate sidewall insulating film 30 is formed by forming a second gate sidewall film 32 and a third gate sidewall film 33. After that, the p-type diffusion layer 63 of high-concentration is formed. Note that in FIG. 8C, since the n-type diffusion layer 62 is extremely thin, illustration of the n-type diffusion layer 62 is omitted. Next, by forming an Ni silicide layer 42 on the source side, and an Ni silicide layer 51 on the drain side, the structure as shown in FIG. 7 mentioned above can be obtained.

In the present embodiment, in a horizontal TFET in which a tunnel current is generated parallel to a gate insulating film 21, a silicide Schottky TFET in which the drain side is formed by a silicide and a low-concentration p-layer is formed. Accordingly, since the high-concentration drain layer and the channel do not form a pn junction, reducing of a reverse direction current is enabled, and an advantage similar to that of the first embodiment can be obtained.

Third Embodiment

FIG. 9 shows a cross-sectional view showing an element structure of a TFET according to a third embodiment. It should be noted that the same portions as those of FIG. 1 will be given the same reference numbers, and detailed explanations of them will be omitted.

The present embodiment relates to a vertical TFET in which the drain side is formed by a Schottky barrier junction of a silicide and a low-concentration p-layer.

The basic structure of the present embodiment is similar to that of the first embodiment, and the point in which the present embodiment is different from the first embodiment is the structure on the source side and the drain side. That is, on the source side of the present embodiment, a p-type diffusion layer 83 of high-concentration for source region formation is formed as in the first embodiment, and further, a source region is formed to overlap with a part of a gate portion 20. Further, in the overlapping portion, a pn junction in which the upper layer side is an n-type diffusion layer 81 and the lower layer side is a p-type diffusion layer 82 is formed. Also, on the drain side, a p$^-$-type layer 84 is formed under an Ni silicide layer 51. It should be noted that the silicide layer 51 extends more to the gate side than the p$^-$-type layer 84, and the silicide layer 51 directly contacts a semiconductor region of a channel to form a drain region.

FIGS. 10A to 10D are cross-sectional views showing a manufacturing process of the TFET of the present embodiment.

In an n-type TFET as in the present embodiment, a p-well and an n$^-$-type layer (a channel) are used. In a p-type TFET, an n-well and a p$^-$-type layer are used. As the conditions of forming each of the wells and channels, the conditions shown in the first embodiment are used.

Figure 10A:
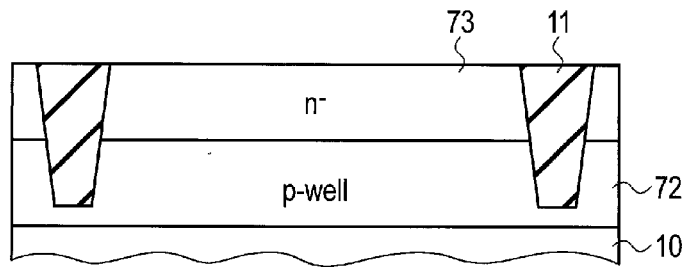
FIGS. 10A to 10D are cross-sectional views showing a manufacturing process of the TFET of the third embodiment.

Firstly, as shown in FIG. 10A, after forming element isolation insulating films 11 having a depth of 200 to 300 nm by a buried element separation method on a p- or n-type silicon substrate 10, a p-type well 72 and an n$^-$-type layer (a channel region) 73 are formed.

Figure 10B:
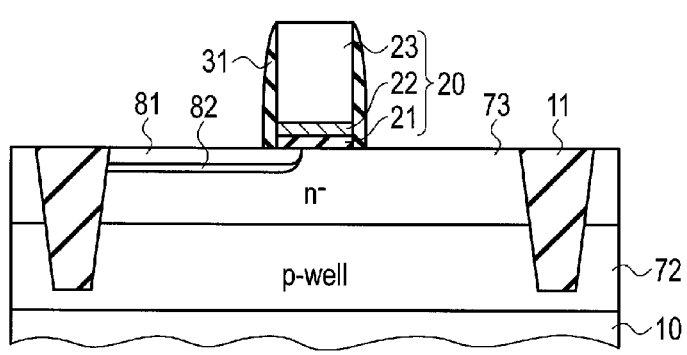

Next, as shown in FIG. 10B, a gate portion 20 is formed on the n$^-$-type layer 73, as shown in FIG. 10B. Further, a first gate sidewall film 31 of SiN is formed, and this is used as an offset spacer. More specifically, after forming SiN to be 3 to 12 nm thick by the LPCVD method, the offset spacer is formed as a result of etching by RIE.

Next, in order to form a tunnel junction, doping is performed in the source region. More specifically, the source region is opened after forming resist films on the entire surface, and after performing ion implantation with BF$_2$ as the doping in the back side, ion implantation with As is performed as the doping in the surface side, thereby forming a tunnel junction on the source side. As typical conditions of ion implantation, the implantation of BF$_2$ is performed at 15 keV and 3×10$^{14}$ cm$^{-2}$ as the doping in the back side, and the implantation of As is performed at 2 keV and 2.4×10$^{14}$ cm$^{-2}$ as the doping in the surface side. In this way, the n-type diffusion layer 81 is formed in a shallow region and the p-type diffusion layer 82 is formed in a deep region such that they partially overlap with the gate portion 20.

In this transistor, preferably, an overlapping region between the source region and a gate electrode is secured as much as possible. Note that in the case of a p-type TFET, the source region is opened, and after performing ion implantation with As at 10 keV and 3×10$^{13}$ cm$^{-2}$ as the doping in the back side, ion implantation is performed with BF$_2$ at 2 keV and 3×10$^{13}$ cm$^{-2}$ as the doping in the surface side, as the typical condition, thereby forming a tunnel junction on the source side.

Figure 10C:
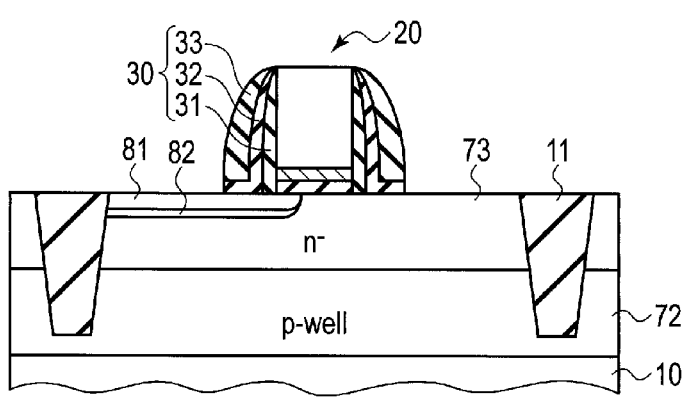

Next, as shown in FIG. 10C, a gate sidewall insulating film 30 is formed by forming a second gate sidewall film 32 and a third gate sidewall film 33.

Figure 10D:
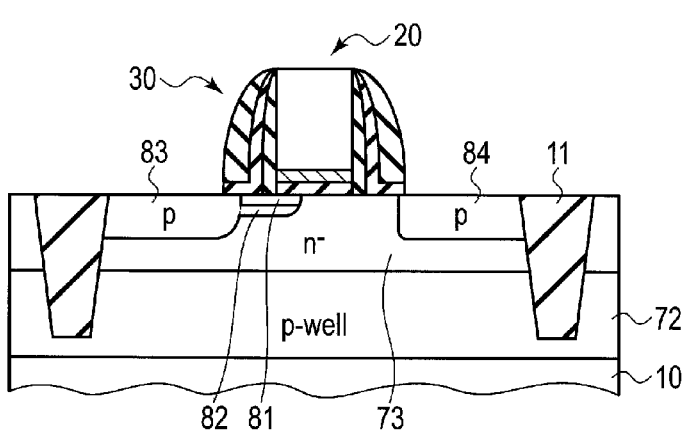

Next, as shown in FIG. 10D, the p-type diffusion layer 83 of high-concentration is formed on the source side by ion implantation. Further, on the drain side, by performing ion implantation to invert the n-type channel into substantially a p-type channel (which is set to be of low concentration even after inversion), the p$^-$-type layer 84 is formed. As typical conditions, the condition of forming a p-type low-concentration layer in the n-type channel is B: 5 keV and 10$^{14}$ cm$^{-2}$, and the condition of forming an n-type low-concentration layer in the p-type channel is P: 5 keV and 10$^{14}$ cm$^{-2}$.

Lastly, by forming an Ni silicide layer 42 on the source side, and the Ni silicide layer 51 on the drain side, the structure as shown in FIG. 9 mentioned above can be obtained.

In the present embodiment, in a vertical TFET in which a tunnel current is generated vertical to a gate insulating film 21, a silicide Schottky TFET in which the drain side is formed by a silicide and a low-concentration p-layer is formed. Accordingly, since the high-concentration drain layer and the channel do not form a pn junction, reducing of a reverse direction current is enabled, and an advantage similar to that of the first embodiment can be obtained.

(Modification)

It should be noted that each of the above-described embodiments is not limited to the above.

A metal on the drain side is not necessarily limited to a silicide, and it is sufficient if the metal is a material which forms the Schottky barrier junction, instead of a pn junction, with the semiconductor layer of the drain region. The substrate and each of the layers are not limited to silicon, and the other semiconductor materials can also be used. The structure of the gate portion, and the structure of the gate sidewall insulating film can be changed as appropriate according to the specification.

The impurity concentration of each of the layers can be changed as appropriate according to the specification. However, the impurity concentration of the semiconductor layer which forms the Schottky barrier junction with the metal on the drain side is preferably be about 2×10$^{19}$ cm$^{-3}$ or less. This is because if the impurity concentration of the semiconductor layer which forms the Schottky barrier junction is too high, band bending in a region surrounded by a circle in FIG. 4 becomes steep. If the band bending becomes steep, even when the TFET is powered off, a tunnel current is generated on the drain side, the effect of forming the Schottky barrier junction may be impaired.

Also, in the first and second embodiments described above, steepness of band-to-band tunneling is moderated if the impurity concentration of the semiconductor layers in the channel region and the drain region is low. Meanwhile, if the impurity concentration of the semiconductor layers in the channel region and the drain region is high, while the steepness of the band-to-band tunneling is increased, operation at a low voltage becomes difficult since a threshold voltage of the TFET is raised. Accordingly, the impurity concentration of the semiconductor layer in both the channel region and the drain region is preferably be set within the range of 5×10$^{18}$ cm$^{-3}$ to 2×10$^{19}$ cm$^{-3}$.

Further, in the first and second embodiments, the case where the semiconductor layer below the silicide in the drain region, and the semiconductor layer at the channel have exactly the same level of impurity concentration has been described. However, even if the impurity concentration in either part of the semiconductor layer is changed, as long as the change is of an insignificant level which does not involve particular doping, such as a change caused by segregation of impurities at the time of silicide formation, for example, that kind of change is accepted as the impurity concentration is considered to be substantially the same in both parts.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A tunnel FET comprising:
   a semiconductor region of a first conductivity type;
   a gate electrode provided on a surface portion of the semiconductor region via a gate insulating film;
   a source region provided in the semiconductor region on one side of the gate electrode, the source region being a region of the first Conductivity type having a higher impurity concentration than the semiconductor region; and
   a drain region provided in the semiconductor region on the other side of the gate electrode, the drain region comprising a metal silicide, wherein
   an impurity concentration of a portion under the metal silicide is substantially the same as an impurity concentration of a channel under the gate electrode.

2. The tunnel FET of claim 1, wherein the impurity concentration of the portion under the metal silicide of the drain region is set within a range of $5 \times 10^{18}$ cm$^{-3}$ to $2 \times 10^{19}$ cm$^{-3}$.

3. The tunnel FET of claim 1, wherein a Fermi level of the metal silicide is between a conduction band (Ec) and a valence band (Ev) of silicon.

4. The tunnel FET of claim 1, further comprising a metal silicide, which makes ohmic contact to the source region, provided in the source region.

5. The tunnel FET of claim 1, wherein a voltage of the same polarity is applied to the gate electrode and the drain region.

* * * * *